United States Patent [19]
Sakata

[11] Patent Number: 6,036,771
[45] Date of Patent: Mar. 14, 2000

[54] METHOD OF MANUFACTURING OPTICAL SEMICONDUCTOR DEVICE

[75] Inventor: Yasutaka Sakata, Tokyo, Japan

[73] Assignee: NEC Corporation, Tokyo, Japan

[21] Appl. No.: 09/161,521

[22] Filed: Sep. 29, 1998

[30] Foreign Application Priority Data

Sep. 30, 1997 [JP] Japan .................................. 9-266645

[51] Int. Cl.[7] ............................................... C30B 25/92
[52] U.S. Cl. ............................ 117/89; 117/954; 117/955; 438/31; 438/29; 438/22; 438/84; 438/46
[58] Field of Search ................. 438/31, 29, 22, 438/84, 46; 117/89, 954, 955

[56] References Cited

U.S. PATENT DOCUMENTS

| | | | |
|---|---|---|---|
| 5,229,319 | 7/1993 | Kawakyu et al. | 437/81 |
| 5,622,559 | 4/1997 | Goto et al. | 117/89 |
| 5,663,592 | 9/1997 | Miyazawa et al. | 257/627 |
| 5,668,047 | 9/1997 | Muroya | 438/31 |
| 5,703,974 | 12/1997 | Sasaki et al. | 385/14 |
| 5,737,353 | 4/1998 | Sasaki | 372/45 |
| 5,756,373 | 5/1998 | Sakata | 438/35 |
| 5,847,415 | 12/1998 | Sakata | 257/96 |
| 5,862,279 | 1/1999 | Amersfoort et al. | 385/40 |
| 5,868,834 | 2/1999 | Shimoyama et al. | 117/104 |
| 5,913,107 | 6/1999 | Sakata | 438/41 |
| 5,917,846 | 6/1999 | Morimoto | 372/46 |
| 5,917,972 | 6/1999 | Davies | 385/43 |

FOREIGN PATENT DOCUMENTS

| | | |
|---|---|---|
| 61-275195 | 12/1986 | Japan . |
| 2-166722 | 6/1990 | Japan . |
| 3-201425 | 9/1991 | Japan . |
| 3-218621 | 9/1991 | Japan . |
| 4-219394 | 8/1992 | Japan . |
| 5-226257 | 9/1993 | Japan . |
| 5-335241 | 12/1993 | Japan . |
| 7-14787 | 1/1995 | Japan . |
| 8-245291 | 9/1996 | Japan . |

*Primary Examiner*—Robert Kunemund
*Assistant Examiner*—Vanessa Perez-Ramos
*Attorney, Agent, or Firm*—Foley & Lardner

[57] ABSTRACT

In a method of manufacturing an optical semiconductor device having a semiconductor substrate, an optical waveguide formed by a semiconductor layer is formed on the semiconductor substrate by the use of the selective metal-organic vapor phase epitaxy including source materials. The source materials are intermittently supplied in the selective metal-organic vapor phase epitaxy.

13 Claims, 9 Drawing Sheets

NON-FLATNESS = ((d max / d min) - 1) × 100 [%]

GROWTH AVERAGE FILM THICKNESS = (d max + d min) / 2 [nm]

METHOD OF MANUFACTURING OPTICAL SEMICONDUCTOR DEVICE

BACKGROUND OF THE INVENTION

This invention relates to a method of manufacturing an optical semiconductor device having a semiconductor optical waveguide.

Disclosure has been made about a conventional method of manufacturing a semiconductor optical waveguide on a semiconductor substrate by the use of the known selective metal-organic vapor phase epitaxy (MOVPE) method using a growth block mask in Proceedings (Journal of Crystal Growth Vol. 170, January 1997, pp. 634–638, K. Kudo et al.).

Conventionally, when an InP/InGaAsP based optical waveguide is formed by the use of the selective MOVPE growth, it is difficult to obtain sufficiently flat InGaAsP layer.

This main reason will be explained as follows.

Namely, a migration length of source material species is short on a surface of a semiconductor substrate. Consequently, the growth takes place before the source material species does not reach a center of a mask-opening portion.

As a result, a portion near the growth block mask of the opening portion (namely, a portion near a side surface of the formed optical waveguide) has a film thickness thicker than the center portion.

Further, a margin of growth condition for enlarging the migration of the source material species is conventionally reduced because the growth conditions suitable for the flatness are different from to each other with respect to the InGaAsP having a variety of compositions.

SUMMARY OF THE INVENTION

It is therefore an object of this invention to provide a method of manufacturing an optical semiconductor device having an optical waveguide which is capable of improving flatness of an optical waveguide.

According to this invention, an optical waveguide formed by a semiconductor layer is formed on a semiconductor substrate by the use of the selective metal-organic vapor phase epitaxy including source materials. In this event, the source materials are intermittently supplied in the selective metal-organic vapor phase epitaxy.

Specifically, the source materials are supplied with a pulse-like shape. Herein, the pulse-like shape has a plurality of pulses and pulse halting intervals.

In this case, the semiconductor layer is formed by a group III–V compound layer. Further, the source materials includes group III material and group V material.

Under this circumstance, the group V material is successively supplied while the group III material is intermittently supplied in the selective metal-organic vapor phase epitaxy.

Moreover, the group III material is supplied by the use of the pulse-like shape with atom layers between 1 and 5 per one pulse. In addition, the pulse-halting interval is one second or more.

More specifically, migration on a semiconductor surface of supplied material is fostered or activated during a supply standby state by intermittently supplying source material gas. Thereby, a flat waveguide structure can be realized by adopting a pulse mode selective growth.

Such a pulse mode selective growth, the material is intermittently supplied in the MOVPE selective growth for directly forming the optical waveguide.

Further, the MQW structure which is formed by the pulse mode selective growth has an excellent crystallinity because the PL spectrum linewidth is narrow. Thereby, it is possible to operate with a low threshold value and a high efficiency by the use of the MQW structure, which is formed by the pulse mode selective growth as the active layer of the semiconductor laser.

Moreover, the MQW structure, which is formed by the pulse mode selective growth, has a narrow PL spectrum linewidth. Consequently, even when the bandgap wavelength is brought near the incidence wavelength, the insertion loss is not increased. Thereby, a large extinction ratio can be realized at a low driving voltage with a small detuning quantity (the detuning quantity=incidence wavelength-bandgap of modulator absorption layer).

In consequence, it is possible to realize the low driving voltage, the high extinction ratio and the low insertion loss by using the MQW structure which is formed by the pulse selective growth as the electro-absorption type semiconductor optical modulator.

DESCRIPTION OF THE PREFERRED EMBODIMENTS

Principle of this Invention

Figure 6:
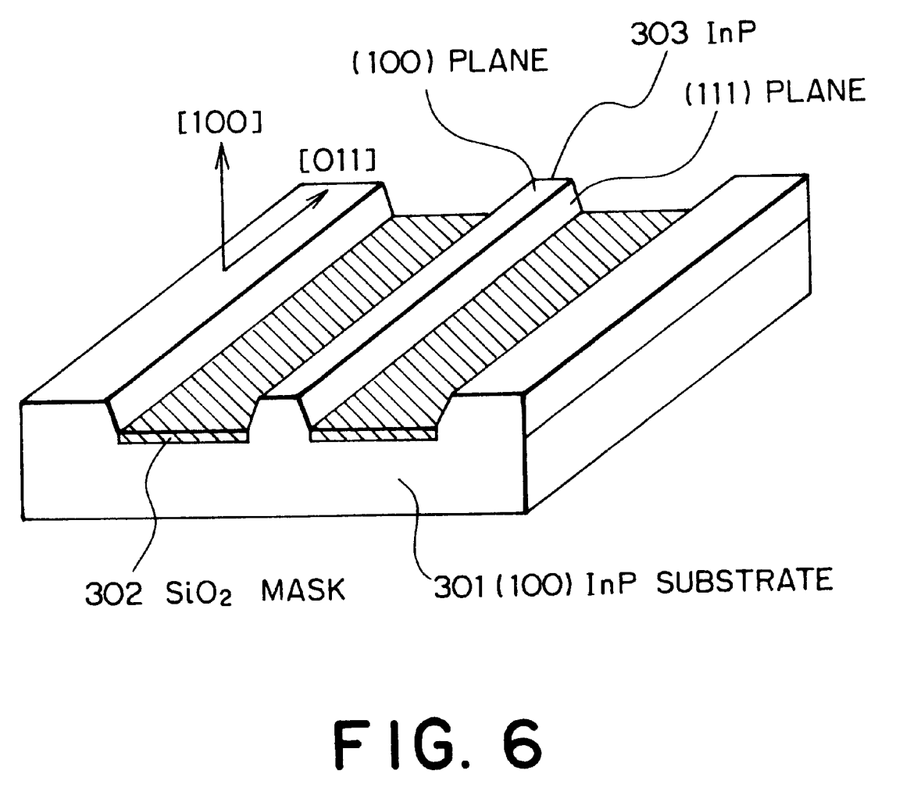
FIG. 6 is a schematic view showing a MOVPE selective growth mask for explaining a principle of this invention.

Description will be first made about a principle of this invention for a better understanding of this invention with reference to FIG. 6.

A pair of stripe masks 302 are first formed with a space of 1.5 μm in a [011] direction on a (100) InP substrate 301. An InP 303 is grown on the space region of 1.5 μm by the use of the MOVPE selective growth. In this event, the selective growth layer 303 has a ridge shape which is surrounded by extremely flat crystal surfaces of a (100) plane at an upper surface and a (111) plane at a side surface.

Consequently, when this structure is used as the optical waveguide, an ideal optical waveguide structure can be realized with a low scattering loss.

Figure 7A:
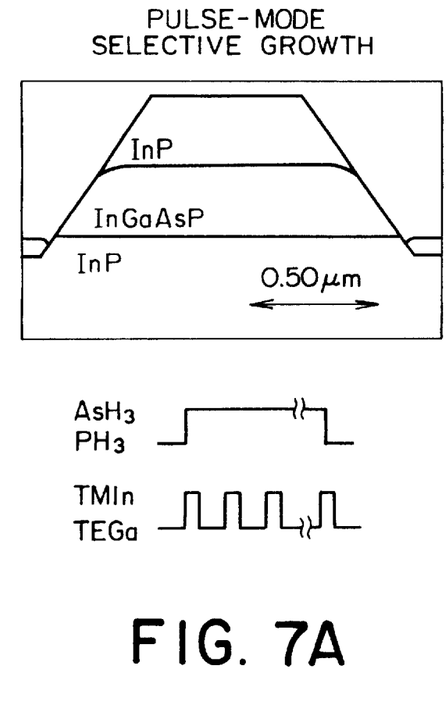
FIGS. 7A and 7B are diagrams for explaining an operation of this invention.
Figure 7B:
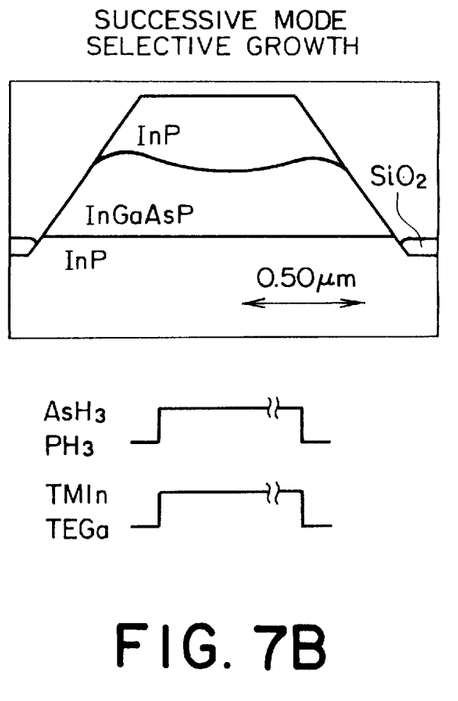

However, when an InGaAsP layer is used as the selective growth layer, a concave or groove shape is formed in a center portion instead of the (100) plane which is flat at the upper surface, as illustrated in FIG. 7B. In this event, the InGaAsP layer is used as a core layer while the InP layer is used as a clad layer in the general InP/InGaAsP based optical waveguide. In the structure illustrated in FIG. 7B, an excellent optical waveguide can not be realized.

Subsequently, description will be made about a reason in which the selective growth shapes are different between the InP layer and the InGaAsP layer.

Namely, the epitaxial growth is not carried out for the source material which reaches the stripe mask 302 (SiO$_2$ mask) or the (111) plane, and the migration is performed for the (100) upper surface, as illustrated in FIG. 6. In this case, the source material which reaches (100) upper plane is consumed by the epitaxial growth.

Under this circumstance, the In source materials are uniformly distributed on the (100) plane because the In source material has enough long migration length at the (100) plane illustrated in FIG. 6.

On the other hand, the Ga source material has a short migration length at the (100) plane. Consequently, the Ga source materials which reach the (100) upper surface can not sufficiently move to the center portion of the (100) plane. As a result, the Ga source materials collects near the side surface of the optical guide. That is, the distribution near the side surface is increased.

From the above-mentioned reason, when the InP layer is selectively grown, the flat (100) plane is formed. In contrast, when the InGaAsP layer is selectively grown, the flat (100) plane is not formed.

Therefore, when the InGaAsP layer is formed by the use of the MOVPE selective growth, a pulse mode selective growth is carried out in this invention. Herein, the source material is intermittently supplied in this pulse mode selective growth. By the pulse mode selective growth, the migration can be fostered or activated during the supply source material is halted. In consequence, the flat (100) upper plane can be obtained, as illustrated in FIG. 7A.

Herein, a reason in which the migration is fostered will be explained as follows.

Namely, when the source material is intermittently supplied, no source material exists on the growth substrate surface in the moment at which the supply of the source material is resumed from the material supply halting state. Consequently, a material concentration gradient between the growth substrate surface and a stagnation layer is larger as compared to the normal successive growth.

When the concentration gradient is large, a ratio of the materials which reach the substrate surface becomes large on the condition that decomposition is not performed. This is because diffusion rate of the material becomes large.

On the condition that the material is not decomposed, the material is immediately not entrapped into the growth layer. Thereby, the migration is carried out for the material on the (100) plane during the decomposition proceeds.

As a result, the migration length of the material species in the pulse mode growth becomes large as compared to the successive growth. Consequently, the flat (100) upper plane can be formed in the InGaAsP layer.

Embodiment

Subsequently, description will be made about an embodiment of this invention with reference to the drawings. First, description will be made about the pulse mode selective growth with reference to FIG. 2.

Figure 2:
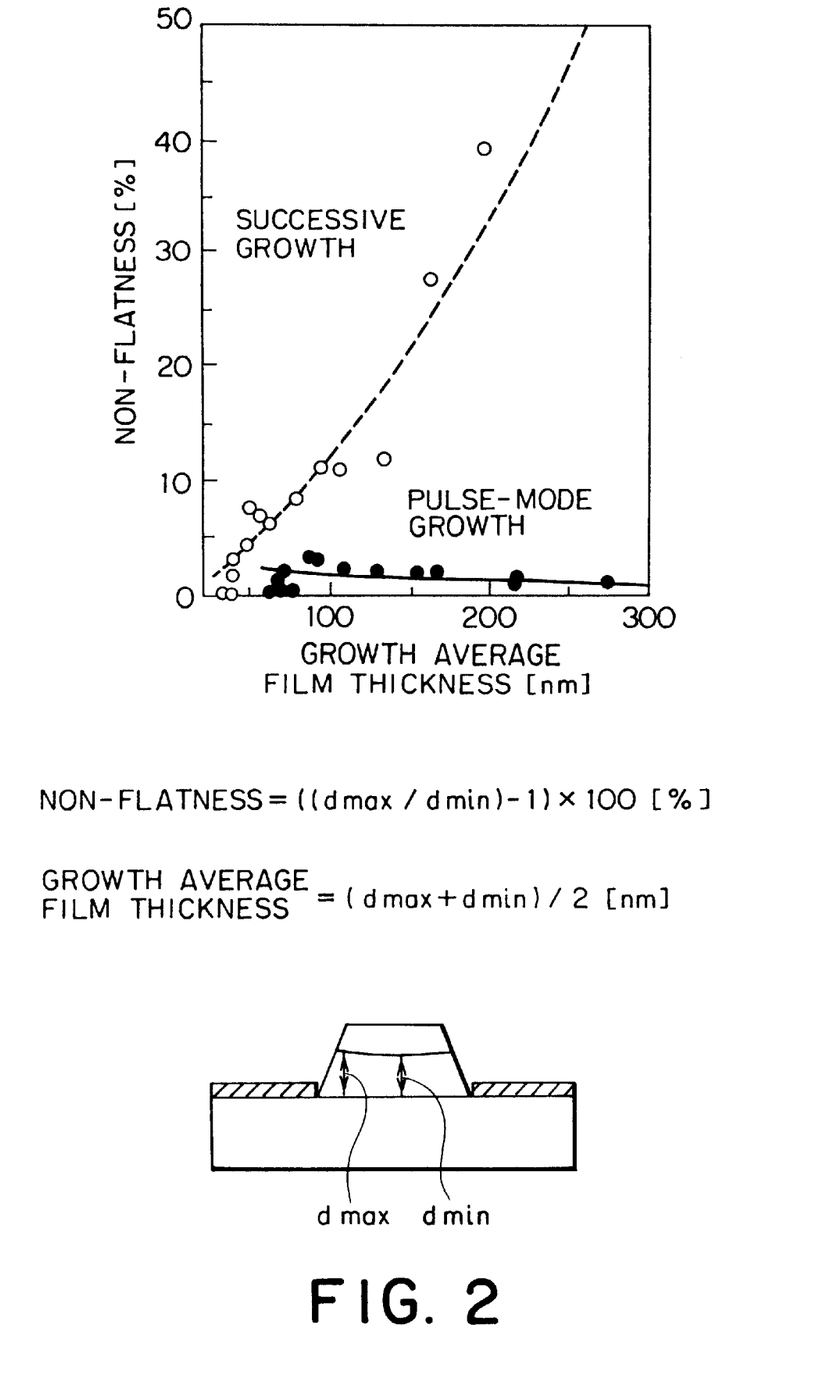
FIG. 2 is a characteristic curve diagram for explaining an operation of this invention.

In FIG. 2, an experimental relationship between a growth film thickness and a flatness is represented with respect to the case in which the InGaAsP layer is formed by the use of the successive selective growth and the case in which it is formed by the use of the pulse mode selective growth.

In this event, abscissa axis indicates the selective growth film thickness while a vertical axis represents non-flatness. Herein, it is to be noted that as the non-flatness becomes large, the flatness is degraded.

In such a experiment, arsine (AsH$_3$) and phosphine (PH$_3$) were used as the group V material, and trimethylindium (TMIn) and triethylgallium (TEGa) were used as the group III material under a growth temperature of 650° C. and a growth pressure of 200 hPa.

In this condition, AsH$_3$ and PH$_3$ were successively supplied while TMIn and TEGa were intermittently supplied. In this case, the supply time was set to 2 seconds (corresponding to the growth time of 1 atom layer) and a standby time was set to one second. Consequently, the flatness was largely improved.

Figure 8:
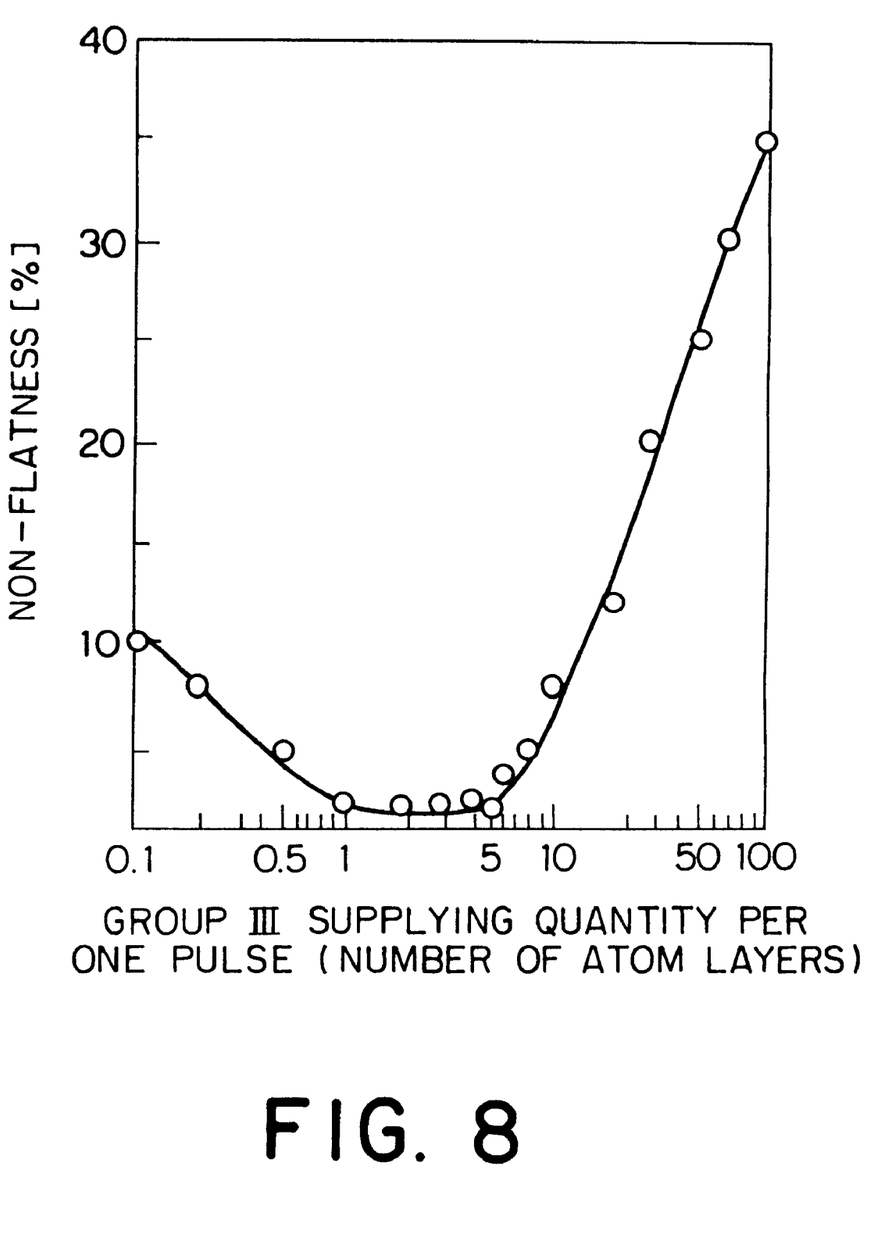
FIG. 8 is a characteristic curve diagram for explaining an operation of this invention.

In the meanwhile, a relationship between the group III material supply quantity and the flatness per one pulse was represented in FIG. 8. Herein, the abscissa axis indicates the growth atom layer (ML: monolayer) number while the vertical axis indicates the non-flatness.

As a result, it is confirmed that the flatness is the most excellent near the group III material supply quantity between 1 to 5 atoms, as illustrated in FIG. 8.

Figure 9:
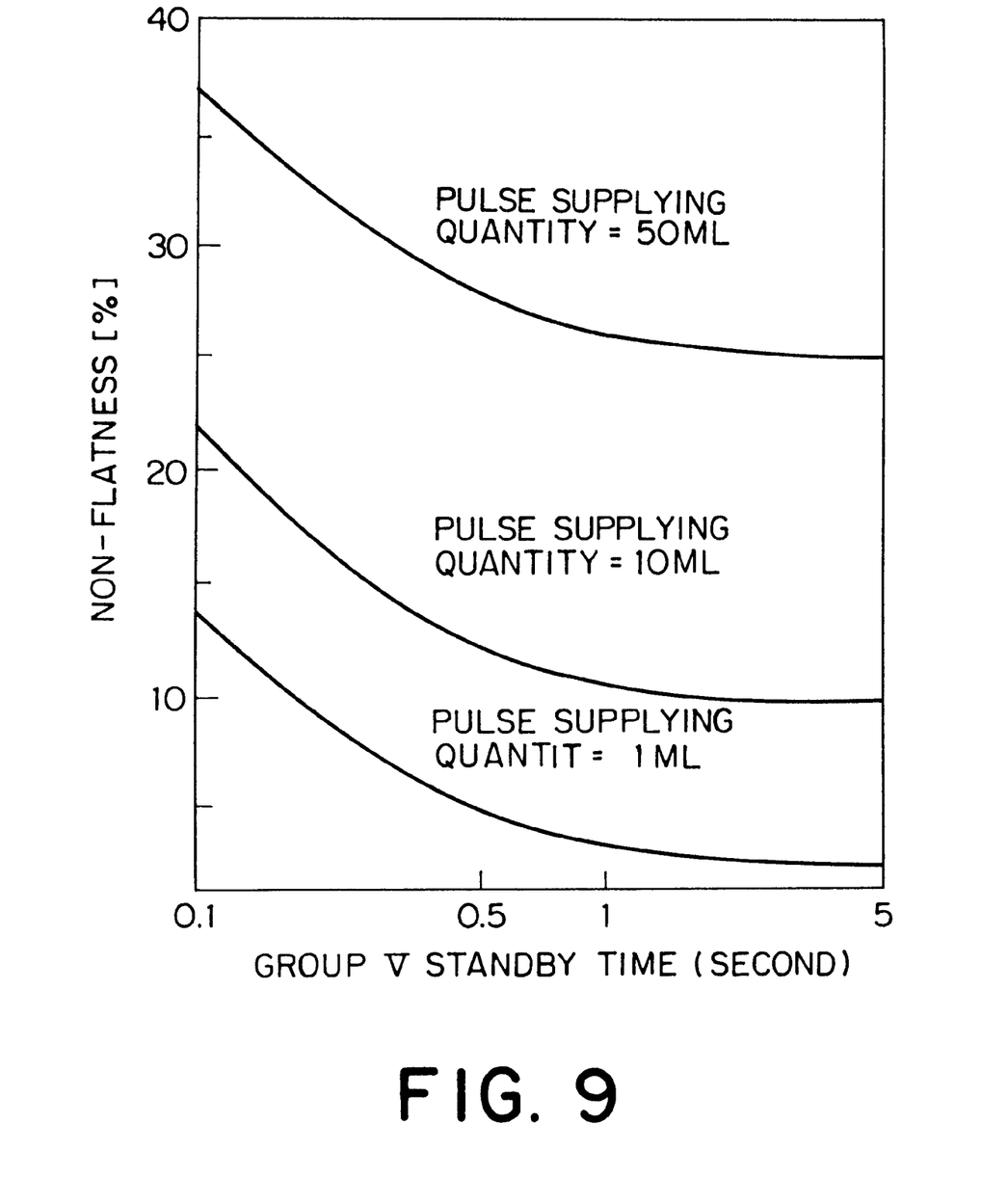
FIG. 9 is a characteristic curve diagram for explaining an operation of this invention.

Further, a relationship between the growth standby time and the flatness is represented in FIG. 9. Herein, the abscissa axis indicates the growth standby time while the vertical axis indicates the non-flatness by using the group III material supply quantity as parameters.

As a result, it is found out that the flatness is improved, as the standby time becomes longer. Further, the effect is saturated before and after one second.

Figure 1A:
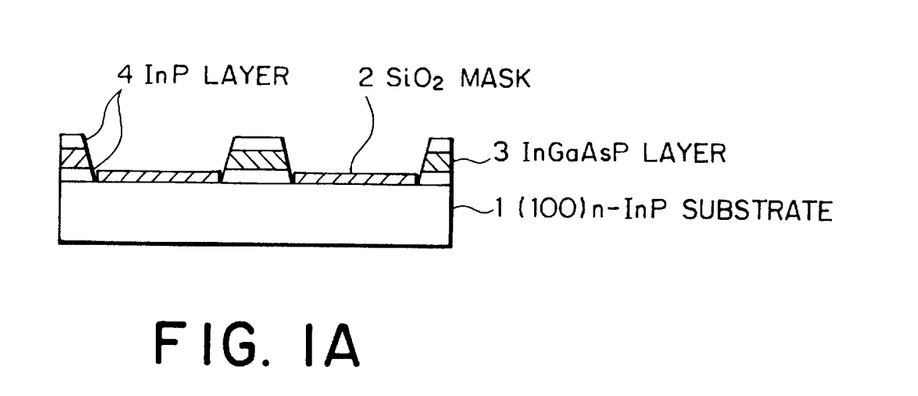
FIG. 1A is a cross sectional view showing an optical semiconductor device according to a first example of this invention.
Figure 1B:
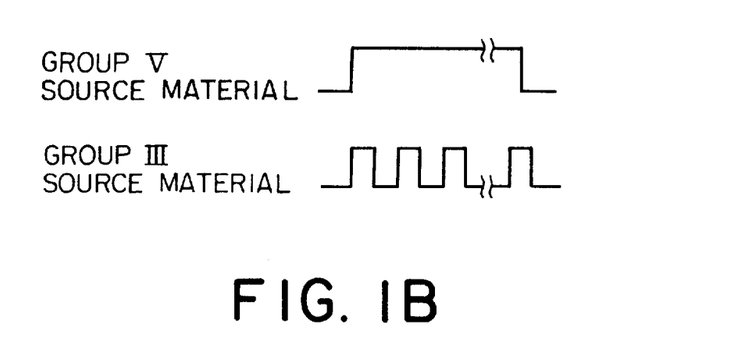
FIG. 1B is diagram for explaining two modes for supplying source materials according this invention.

As mentioned before, the source materials are intermittently supplied in the crystal growth in which the semiconductor optical waveguide is directly formed by the use of the MOVPE selective growth method, as shown in FIG. 1.

Hydride, such as, the arsine (AsH$_3$) and the phosphine (PH$_3$) or an organic group V material, such as (tertiarybutyl arsine) (TBAs) and (tertiarybutyl phosphine) (TBP), was used as the group V material, and an organic metal material was used as the group III material under the growth temperature between 600° C. and 700° C. and the growth pressure between 30 hPa and 1000 hPa as an optimum example for forming group III–V compound layer by the use of the MOVPE selective growth.

In the pulse growth method, as the group V material was successively supplied while the group III material was supplied with quantity corresponding to one atom layer per one pulse. In this event, the standby time (group III supply halting time) was set to one second or more.

Thus, the material is intermittently supplied in this invention. In consequence, the migration of the source material species is activated on the growth substrate surface. As a result, the flat optical waveguide structure can be realized.

FIRST EXAMPLE

Subsequently, description will be made about a first example of this invention with reference to FIG. 1A.

As illustrated in FIG. 1A, SiO$_2$ film are deposited on a (100) n-InP substrate 1 to a thickness of 100 nm by the use of the known thermal chemical vapor deposition (CVD)

method, as illustrated in FIG. 1A. Thereafter, a pair of stripe masks 2 are patterned with a space of 1.5 μm in the [011] direction.

By using the pattern substrate, the InP/InGaAsP (bandgap wavelength: 1.29 μm) double hetero-structure is selectively grown by the MOVPE method.

Herein, the growth is carried out under the growth pressure of 200 hPa, the growth rate of 0.60 μm/h and the V/III ratio of 200. Further, the growth of the InGaAsP layer is performed by the pulse mode, as illustrated in FIG. 1B. In this event, the pulse mode growth is carried out as one cycle of 3 seconds having the growth time of 2 seconds and the V standby time of 1 second.

SECOND EXAMPLE

Subsequently, description will be made about a second example of this invention with reference to FIG. 3.

In the second example, a strained multi-quantum well (MQW) structure is formed as an active layer by the use of the selective growth method. The MQW structure is applied to a buried hetero (BH) type semiconductor laser.

Figure 3A:
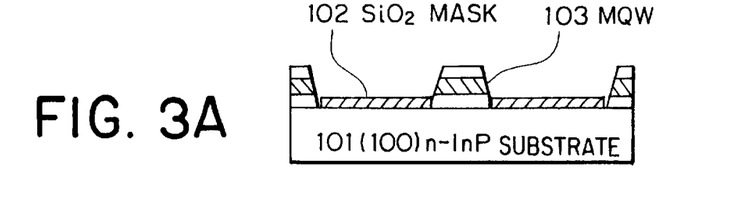
FIGS. 3A through 3E are diagrams for explaining a method of manufacturing an optical semiconductor laser according to a second example of this invention.

As illustrated in FIG. 3A, a SiO$_2$ film is deposited on the (100) n-InP substrate 101 to the thickness of 100 nm by the use of the thermal CVD method. Thereafter, a pair of stripe masks 102 each of which has a width of 5 μm are patterned with a space of 1.5 μm in the [011] direction.

Next, the strained MQW structure 103 is selectively grown for the space region of 1.5 μm, as shown in FIG. 3A. In this event, the layer structure is composed of an n-InP buffer layer (thickness: 100 nm, n=1×10$^{18}$ cm$^{-3}$), strained MQW structure of six periods consisting of a well layer of the InGaAsP having compressive strain of 0.7% and a barrier layer of the InGaAsP having composition of the bandgap wavelength of 1.13 μm, and a p-InP layer (thickness: 200 nm, p=7×10$^{17}$ cm$^{-3}$).

Herein, the growth is carried out under the growth temperature of 650° C., the growth pressure of 200 hPa, the growth rate of 0.60 μm/h and the V/III ratio of 200.

Under this circumstance, the pulse mode growth is carried out with one cycle of 3 seconds having the growth time of 2 seconds and the standby time of 1 second.

In this case, the strained MQW DH structure was evaluated by the use of the micro-area photo-luminescence (micro PL) measurement. The micro PL was measured by using an Ar laser light beam (wavelength: 514.5 nm) which is focused in a diameter of 1 μm as excitation optical source. In consequence, the PL peak wavelength was 1.31 μm.

Figure 4:
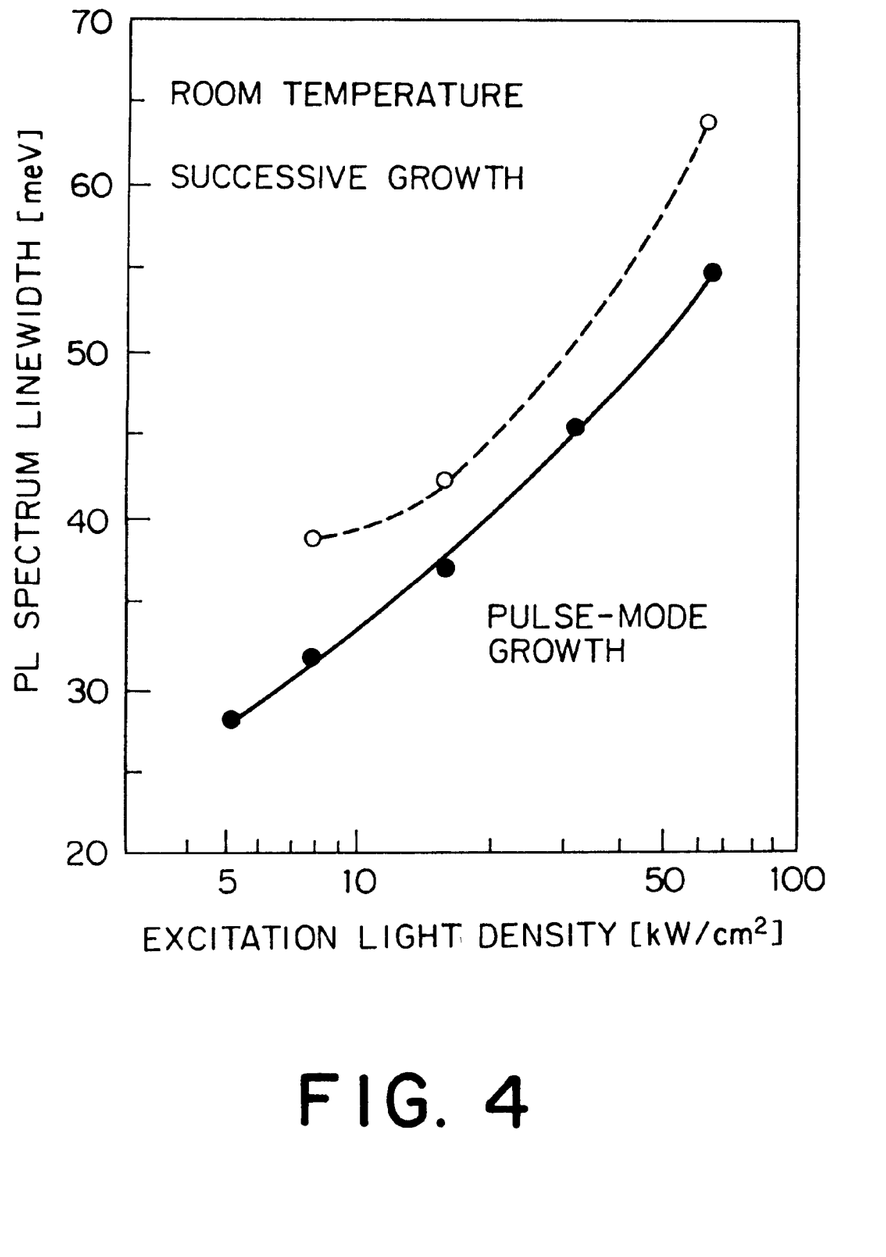
FIG. 4 is a characteristic curve diagram for explaining an operation of this invention.

In FIG. 4, excitation light density dependency is represented with regard to the PL spectrum linewidth. Herein, it is to be noted that the solid line indicates the measurement result of the strained MQW structure which is formed by the use of the pulse mode selective growth.

In comparison, the broken line indicates the measurement result of the strained MQW structure which is formed by the use of the successive mode selective growth.

In the both cases, as the excitation light density is increased, the PL linewidth is also increased. This phenomenon is caused by the known band filling effect and the thermal effect.

However, the PL spectrum linewidth of the DH structure formed by the pulse mode selective growth is narrower within the range between 5 meV and 10 meV in the both excitation light density. This fact reflects the flatness of the InGaAsP layer and means that an excellent crystallinity is obtained by the use of the pulse mode growth.

Figure 3B:
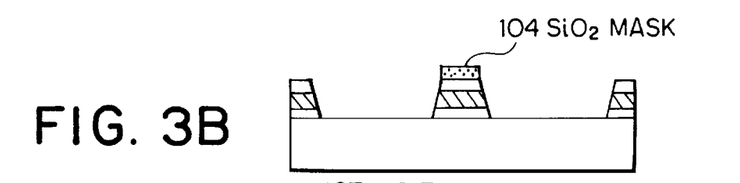
Figure 3C:
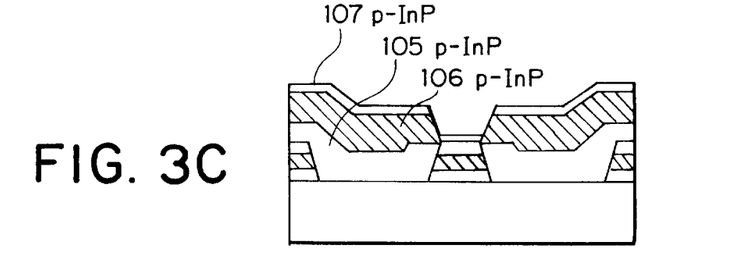

Subsequently, a SiO$_2$ mask 104 is formed on the upper surface of the strained MQW structure, as illustrated in FIG. 3B. Thereafter, current block layers 105, 106 and 107 are embedded by the use of the selective growth using the SiO$_2$ mask 104 as the selective growth mask, as shown in FIG. 3C.

In this event, although the p-InP layer 107 is formed so as to prevent the formation of a pn junction on a re-grown interface, it may not be always necessary in this invention.

Figure 3D:
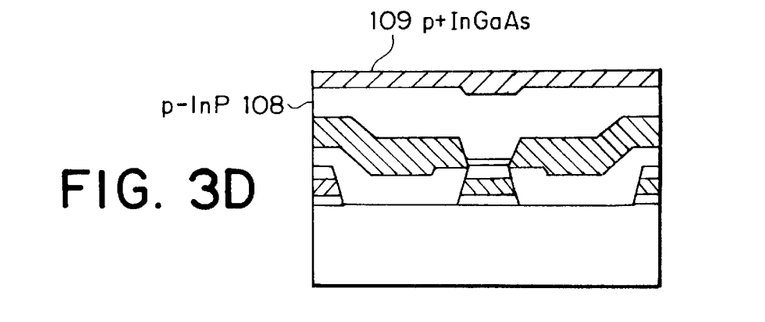

Finally, the SiO$_2$ mask 104 is removed, and a p-InP clad layer 108 and a p$^+$-InGaAs cap layer 109 are grown, as illustrated in FIG. 3D.

Figure 3E:
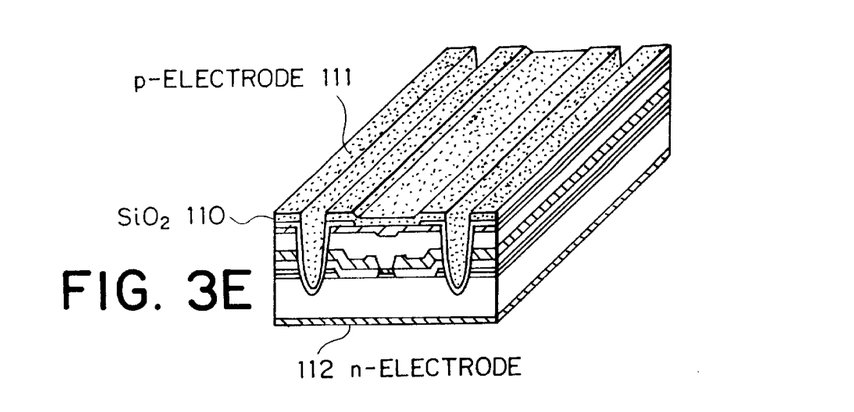

After an electrode formation process is carried out, a semiconductor laser illustrated in FIG. 3E is completed.

This device was cut out with a length of 300 μm. Further, a reflection film is coated thereon. Herein, the reflection film had index of reflection of 30% at a forward end surface and index of reflection of 90% at a rear end surface, respectively.

In this condition, the device characteristic was evaluated for each of 15,366 of devices, which were obtained from a total surface of a 2-inch wafer. As a result, each device had an average value of laser oscillation threshold current of 3.75 mA (standard deviation ±0.12 mA) and an average value of slope efficiency of 0.612 W/A (standard deviation ±0.022 W/A) at the room temperature.

On the other hand, the device had the average value of the laser oscillation threshold current of 10.2 mA (standard deviation ±0.75 mA) and the average value of the slope efficiency of 0.505 W/A (standard deviation ±0.041 W/A) at the temperature of 85° C.

THIRD EXAMPLE

Subsequently, description will be made about a third example of this invention with reference to FIG. 5.

In third example, this invention is applied to the known electric field absorption type optical modulator.

Figure 5A:
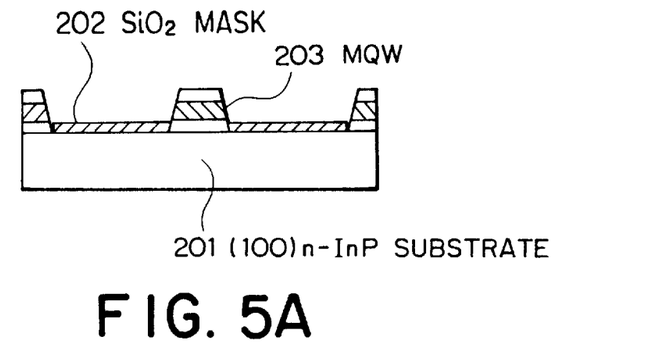
FIGS. 5A through 5C are diagrams for explaining a method of manufacturing an optical semiconductor laser according to a third example of this invention.

As illustrated in FIG. 5A, a pair of SiO$_2$ masks 202 are formed on a (100) n-InP substrate 201 in the [011] direction with a space of 1.5 μm. Herein, each of the SiO$_2$ masks 202 has a width of 8 μm.

Subsequently, a multi-layer structure 203 is selectively grown for the space region of 1.5 μm by the use of the MOVPE selective growth, as shown in FIG. 3A. In this event, the layer structure is coposed of an n-InP buffer layer (thickness: 100 nm, n=1×10$^{18}$ cm$^{-3}$), strained MQW structure of eight periods consisting of a well layer (6 nm-thick) of the InGaAsP having compressive strain of 0.45% and a barrier layer (6 nm-thick) of the InGaAsP having composition of the bandgap wavelength of 1.20 μm, and a p-InP layer (thickness: 100 nm, n=7×10$^{17}$ cm$^{-3}$).

In this case, the strained MQW structure is formed by the use of the pulse mode selective growth, like the above first example.

In this condition, the crystal evaluation was carried out for the structure by the micro PL. As a result, the PL peak wavelength was 1.52 μm. Moreover, the PL spectrum linewidth was 22 meV and had the extremely narrow value. The narrower value than the PL spectrum linewidth obtained in the first example can be realized in the third example.

This reason will be described as follows.

Namely, the carrier density per one layer of the well layer is low and the band filling effect is small because the period of the MQW is many (that is, eight layers).

Figure 5B:
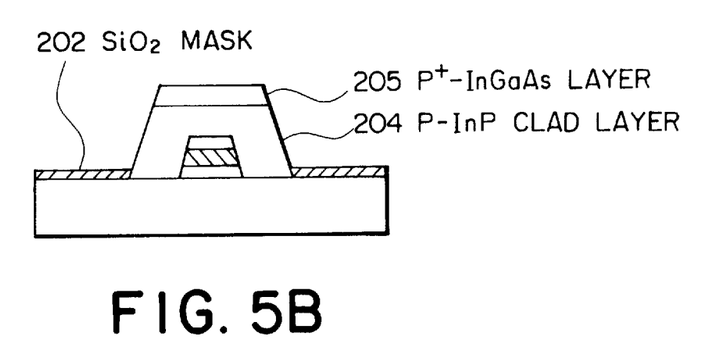
Figure 5C:
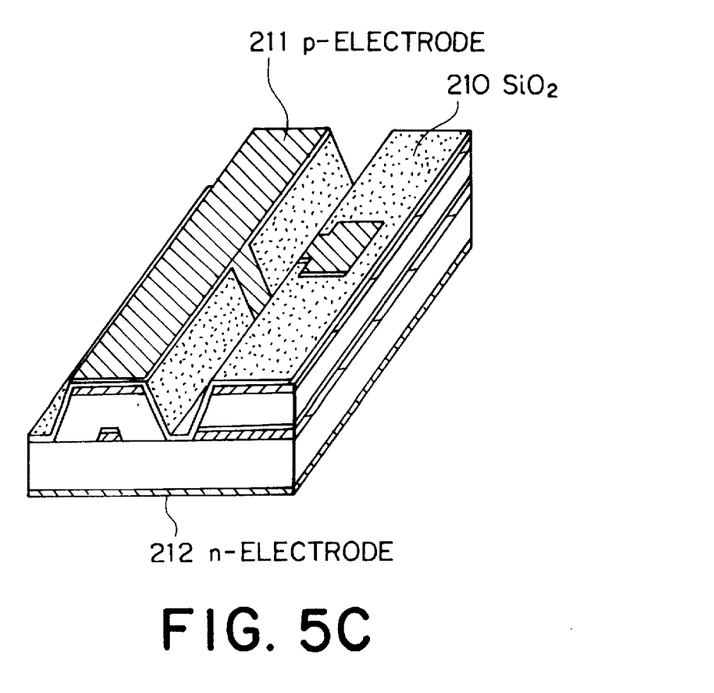

Subsequently, a part of the SiO$_2$ mask is removed so that the mask opening width is set to 5 μm, as shown in FIG. 5B.

Thereafter, a p-InP clad layer 204 (150 nm, p=1×10$^{18}$ cm$^{-3}$) and p$^+$InGaAs cap layer 205 (300 nm, p=6×10$^{18}$ cm$^{-3}$) are selectively grown, as illustrated in FIG. 5B.

Next, the electrode formation process is carried out for this structure and is cut out into the device length of 200 μm. Finally, non-reflection films are coated on both end surface to obtain the electric field absorption type semiconductor optical modulator illustrated in FIG. 5C. Herein, it is to be noted that the non-reflection film had the index of reflection of 0.1% or less.

In this condition, the device characteristic was evaluated for each of 27,684 of devices, which were obtained from a total surface of a 2-inch wafer. As a result, each device had an average value 15.22 dB (standard deviation ±0.95 dB) of extinction ratio at a driving voltage of 1 V for an incidence light beam having wavelength of 1.552 μm and the average value 22.13 dB (standard deviation ±1.53 dB) of the extinction ratio at the driving voltage of 2 V for the incidence light beam having wavelength of 1.552 μm.

Further, the device had the average value of 3.22 dB (standard deviation ±0.28 dB) regarding insertion loss.

Thus, it is found out that the device has a high extinction ratio and a low insertion loss.

This reason will be described as follows.

Namely, the strained MQW absorption layer which is formed by the pulse mode selective growth has an excellent crystallinity and extremely narrow PL spectrum linewidth. Thereby, even when the bandgap wavelength (1.52 μm) of the strained MQW absorption layer is brought near the incidence wavelength (1.552 μm) in order to obtain a large extinction ratio at a low voltage, absorption loss at zero-bias can be lowery suppressed.

In the above examples, although the SiO$_2$ film is used as the growth block mask, the other kinds of films, such as the other silicon oxide film, and a silicon nitride film, may be used.

What is claimed is:

1. A method of manufacturing an optical semiconductor device having a semiconductor substrate, comprising the step of:

forming an optical waveguide formed by a semiconductor layer on said semiconductor substrate by the use of the selective metal-organic vapor phase epitaxy including source materials, the source materials being intermittently supplied in the selective metal-organic vapor phase epitaxy.

2. A method as claimed in claim 1, wherein:

the source materials are supplied with a pulse-like shape, the pulse-like shape having a plurality of pulses and pulse halting intervals.

3. A method as claimed in claim 2, wherein:

said semiconductor layer is formed by a group III–V compound layer.

4. A method as claimed in claim 3, wherein:

the source materials includes group III material and group V material, and the group V material is successively supplied while the group III material is intermittently supplied in the selective metal-organic vapor phase epitaxy.

5. A method as claimed in claims 3, wherein: the group III material is supplied by the use of the pulse-like shape with atom layers between 1 and 5 per one pulse.

6. A method as claimed in claims 2, wherein: the pulse-halting interval is one second or more.

7. A method of manufacturing an optical semiconductor device having a semiconductor substrate, comprising the step of:

forming an optical waveguide formed by a semiconductor layer on said semiconductor substrate by the use of the selective metal-organic vapor phase epitaxy including source materials, said semiconductor layer having an InP layer and an InGaAsP layer, the source materials being intermittently supplied so as to form only the InGaAsP layer in the selective metal-organic vapor phase epitaxy.

8. A method as claimed in claim 7, wherein:

the source materials are supplied with a pulse-like shape, the pulse-like shape having a plurality of pulses and pulse halting intervals.

9. A method as claimed in claim 7, wherein:

the source materials includes group III material and group V material, and the group V material is successively supplied while the group III material is intermittently supplied in the selective metal-organic vapor phase epitaxy.

10. A method as claimed in claims 8, wherein:

the group III material is supplied by the use of the pulse-like shape with atom layers between 1 and 5 per one pulse.

11. A method as claimed in claims 8, wherein:

the pulse-halting interval is one second or more.

12. A method as claimed in claim 11, wherein:

the group III material includes Ga material having a predetermined migration length, the migration length being fostered during the pulse halting interval on the InGaAsP layer.

13. A method as claimed in claim 12, wherein:

the migration length is fostered so as to obtain a flat surface on the InGaAsP layer.

* * * * *